United States Patent [19]
Xin et al.

[11] Patent Number: 5,807,809
[45] Date of Patent: Sep. 15, 1998

[54] METHOD OF FABRICATING THIN FILM SUPERCONDUCTING MATERIALS

[75] Inventors: Ying Xin; Bingruo Xu, both of Lawrence, Kans.; Iatneng Chan, Fayetteville, Ark.; Greg J. Salamo, Fayetteville, Ark.; Fui T. Chan, Fayetteville, Ark.

[73] Assignees: Midwest Superconductivity, Inc., Lawrence; The University of Arkansas, Fayetteville, both of Ark.; a part interest

[21] Appl. No.: 887,089

[22] Filed: Jul. 2, 1997

(Under 37 CFR 1.47)

Related U.S. Application Data

[63] Continuation of Ser. No. 296,456, Aug. 26, 1994, abandoned, which is a continuation-in-part of Ser. No. 63,266, May 17, 1993, abandoned.

[51] Int. Cl.$^6$ .............................. H01L 39/24; B05D 5/12
[52] U.S. Cl. ......................... 505/474; 505/473; 505/501; 505/120; 505/742; 505/785; 427/62; 427/596
[58] Field of Search .................................. 505/474, 473, 505/501, 120, 785, 742; 427/62, 596

[56] References Cited

PUBLICATIONS

Tang et al, Supercond. Sci. Technol. 5 (1992) pp. 538–541.
Ladd et al, Appl. Phys. Lett. 59(11), Sep. 1991, pp. 1368–1370.
Adachi et al, Jpn. J. Appl. Phys. 30(6B) Jun. 1991, pp. L1110–L1113.
Liu et al, Appl. Phys. Lett. 56(21) May 1990, pp. 2135–2137.
Tang et al, Jpn. J. Appl. Phys. 31 (1992) pp. 3851–3852.
Shah et al, Appl. Phys. Lett. 56(8) Feb. 1990, pp. 782–784.
Koike et al, Jpn. J. Appl. Phys. vol. 32 (1993) pp. L828–L831.
Hammond et al, Appl. Phys. Lett. 57(8) Aug. 1990, pp. 825–827.
Politis et al, Modern Physics Letters B, vol. 2, No. 9 (1988) pp. 1119–1123.

*Primary Examiner*—Roy V. King
*Attorney, Agent, or Firm*—Hovey,Williams,Timmons & Collins

[57] ABSTRACT

Improved superconducting thin films are provided having very high $T_c$ (zero) and $J_c$ values, on the order of greater than or equal to 120K and $10^5$ A/cm$^2$ or greater, respectively. The films of the invention are adapted for deposit and support on a compatible substrate, and include a superconductive material, most preferably $Tl_2Ba_2Ca_2Cu_3O_{10}$, with up to about 10% elemental gold admixed with the superconductive material. The preferred method for fabricating the thin film superconductors comprises first forming a non-superconducting precursor film on a compatible substrate which is placed in contact with an unsintered bulk body containing thallium; the substrate with precursor film are sintered with the bulk body to form the desired superconductor material.

11 Claims, 2 Drawing Sheets

METHOD OF FABRICATING THIN FILM SUPERCONDUCTING MATERIALS

RELATED APPLICATION

This application is a continuation, of application No. 08/296,456, filed Aug. 26, 1994, now abandoned, which is a continuation-in-part of application No. 08/063,266 filed May 17, 1993, now abandoned.

BACKGROUND OF THE INVENTION

1. Field of the Invention

The present invention is broadly concerned with improved thin film thallium superconductors in the form of a compatible oxide substrate having a thin (e.g., up to about 10,000 Å) layer of thallium superconductive material (e.g., Tl-2223 $Tl_2Ba_2Ca_2Cu_3O_{10}$) preferably with elemental gold admixed therewith. More particularly, the invention concerns such thin film superconductors, as well as a method of fabrication thereof wherein in preferred forms, Ba:Ca:Cu:O 223 precursor components and gold are first layered on a compatible substrate (preferably by laser ablation techniques), whereupon the precursor is heated in the presence of $Tl_2O_3$ to form the complete thin film superconductor.

2. Description of the Prior Art

Among the various cuprate superconductors, the thallium family is of great interest. This stems from the fact that the Tl-2223 ($Tl_2Ba_2Ca_2Cu_3O_{10}$) superconductor has the current record critical temperature ($T_c$) of 125 K, and also because this thallium superconductor is more stable than other cuprates in the sense of crystal structure and oxygen content through thermal cycling. As early as 1988, Tl:Ba:Ca:Cu:O films were prepared by different deposition techniques on MgO, $SrTiO_3$, $LaAlO_3$, $NdGaO_3$ and Yttrium-stabilized substrates. Such thallium-based films were found to consist mainly of the $Tl_2Ba_2CaCu_2O_8$ phase with a $T_c$ of about 100 K. One group reported fabrication of films consisting mostly of the $Tl_2Ba_2Ca_2Cu_3O_{10}$ phase with a $T_c$ of up to about 121 K. Unfortunately, the critical transport current density ($J_c$) was quite low for these early thallium-based superconducting films.

In 1991, $Tl_2Ba_2Ca_2Cu_3O_{10}$ films having $J_c$ values on the order of $10^7 A/cm^2$ were reported. However, the $T_c$ values of these films were only around 110 K, some 15 K lower than the intrinsic $T_c$ of the material.

U.S. Pat. No. 5,082,825 to Hermann et al. describes a two-step process for the production of Tl-based superconducting films. In this process, starting oxides are ground, compressed, heated and cooled, followed by subsequent heating of the resultant pellet in the presence of $Tl_2O_3$. The maximum $T_c$ reported in this patent was approximately 110 K; $J_c$ values were not reported.

SUMMARY OF THE INVENTION

The present invention overcomes the problems outlined above, and provides an improved thin film superconductor having very high $T_c$ and $J_c$ values. Broadly speaking, a superconducting thin film in accordance with the invention is adapted for deposit and support on a compatible substrate. The material is preferably of the general formula $Q_nTl_xM_zCa_qCu_dO_{10-y}$, where Q is selected from the group consisting of Pb, Rb, Hg, Cr, Re, K, Na, Se, and Te, M is selected from the group consisting of Ba and Sr, n ranges from about 0–0.5, x ranges from about 1–2.5, z ranges from about 0.5–2, q ranges from about 1.5–3, d ranges from about 3–4, and y is an oxygen deficiency factor which is less than about 1.

Preferably, the Tl-based superconducting material has no "Q" dopent, i.e., n is zero. Where such a "Q" dopent is employed, n would typically range from 0.05–0.5. The most preferred superconductive material is $Tl_2Ba_2Ca_2Cu_3O_{10}$. Whatever superconductive material used, it is preferred that the material have a T (zero) greater than about 110 K and a $J_c$ of about $10^5 A/cm^2$ or greater at 77 K and zero magnetic field. Most advantageously, the $T_c$ (zero) should be greater than about 120 K, and the $J_c$ should be about $10^6 A/cm^2$ or greater.

The preferred overall layer including the superconductive material and gold should have thickness of up to about 10,000 Å, and more preferably from about 1,000–5,000 Å. The gold content of the layer is preferably from about 3–8% by weight.

A variety of substrates may be used as a support for the superconductive layer, so long as the support is compatible, i.e., does not appreciably detract from the superconducting properties of the layer. In practice, materials selected from the group consisting of MgO, $LaAlO_3$, $SrTiO_3$ and $NdGaO_3$ can be used to good effect.

In terms of manufacturing processes, and specifically in the context of the preferred $Tl_2Ba_2Ca_2Cu_3O_{10}$, the first step involves forming a Ba:Ca:Cu:O 223 precursor with up to about 10% by weight gold on a compatible substrate, followed by heating the precursor and substrate in the presence of $Tl_2O_3$ to form a layer of $Tl_2Ba_2Ca_2Cu_3O_{10}$ with gold admixed therewith. A laser ablation technique is advantageously used to form the precursor layer on the substrate.

More generally, the method of the invention relates to a two-step process for making the thin film superconductor wherein a non-superconducting precursor film is formed on a compatible substrate, whereupon the substrate with precursor film thereon is placed in contact with an unsintered bulk body containing thallium. Thereafter, the substrate with precursor film thereon is sintered with the bulk body to form a thin film superconductor having the above generalized formula. In this aspect of the invention, it is not necessary that the precursor film have an amount of gold or other elemental metal therein.

DETAILED DESCRIPTION OF THE PREFERRED EMBODIMENTS

The following example sets forth the preferred technique for fabrication of superconductors in accordance with the invention. It is to be understood, however, that the example is provided by way of illustration only, and nothing therein should be taken as a limitation upon the overall scope of the invention.

EXAMPLE

Figure 1:
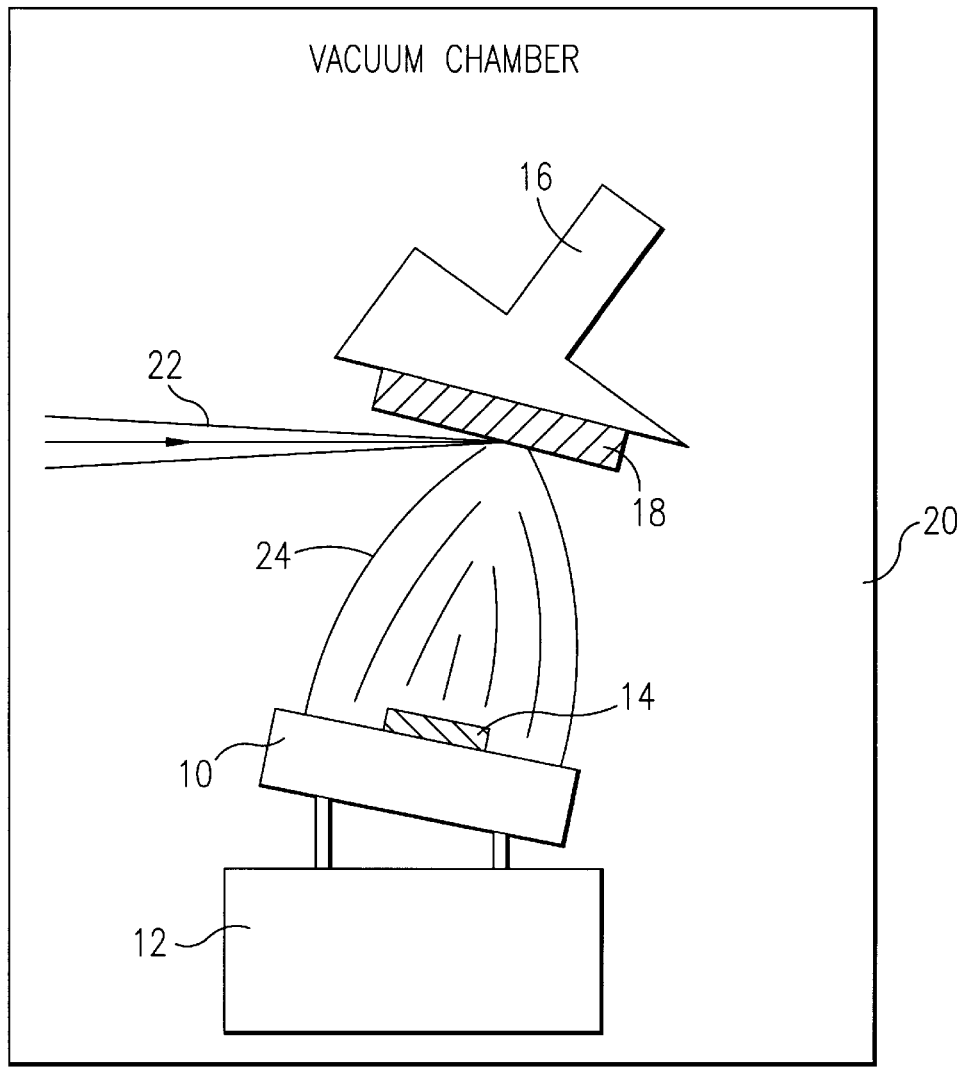
FIG. 1 is a schematic representation of the preferred vacuum ablation chamber used for the fabrication of thin film precursors in accordance with the invention.

In this example, a thin film product containing elemental gold was prepared using the apparatus of FIG. 1. This apparatus included an electrical resistance heating block 10 situated atop a stage 12 for supporting a substrate 14, together with a rotating holder 16. The holder 16 carried a target 18 formed of precursor material. This structure was housed within a vacuum chamber 20 as shown. An external excimer laser emitting a beam 22 was employed to ablate the target 18, thereby creating a plume 24 of target material which was deposited on the underlying substrate 14. Thereafter, the substrate 14 carrying the deposited layer was placed in an unsintered, bulk Tl-2223 boat, and positioned in a tube furnace for sintering and completion of the thin film superconducting product.

Figure 1A:
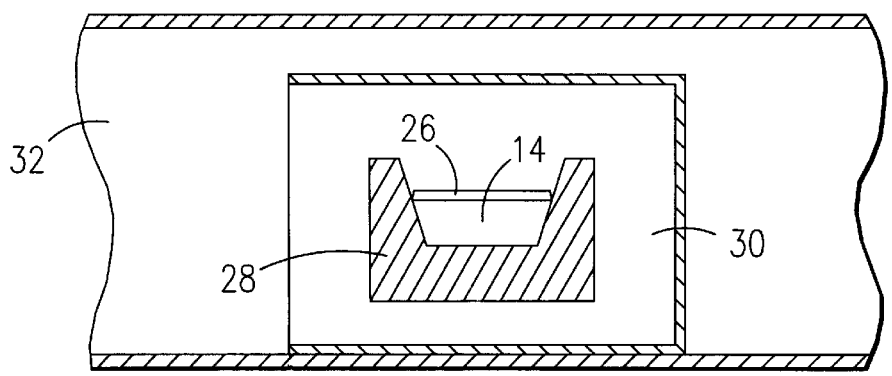
FIG. 1A is a schematic illustration of the sintering furnace apparatus used in the second step in the formation of the thin film superconductors of the present invention.

In particular, the pellet targets for the laser ablation processing were prepared from high purity $BaO_2$, CaO, CuO, and Au (99.99%, 1.8–2.3 $\mu$m) starting powders using a molar ratio of Ba:Ca:Cu =2:2:3. The amount of Au was determined by weight, with gold accounting for 5% of the precursor target material. After homogeneously mixing and grinding, the pellet was uniaxially cold pressed at a pressure of 10,000 kg/cm² using a hydraulic press. The pellet was then heated at 900° C. for 10 hours in air. The resulting target was then placed on the rotatable holder inside the vacuum chamber at 200 ×10³ Torr oxygen as shown in FIG. 1. The excimer laser beam was focused into the chamber and onto the target, which was rotated at 20 rpm. The target-substrate distance was approximately 300 mm. The excimer laser was operated using an Ar and $F_2$ mixture producing about 100 milijoules in a 10 nanosecond pulse at a wavelength of 1930 Å. The laser output was focused on the target, using a quartz lens of 500 mm focal length, with an approximate focused laser spot size at the target of about 100 ×200 $\mu$m². At a laser repetition rate of 10 Hz, the time for forming a 0.4 $\mu$m thick film 26 (FIG. 1A) was about 30 minutes.

The substrate was maintained at a temperature of 600° C. using the electrical heating block. These values were chosen to optimize the uniformity of the thin film formed on the substrate. The as-deposited Au-added precursor film was transparent and brown in color. The substrates used were pure MgO and pure $LaAlO_3$ having dimensions of 0.5×5×5 mm³ and 0.5×10×10 mm3.

In order to make a comparison, an identical bulk ceramic precursor without gold ($Ba_2Ca_2Cu_3O_x$) was employed in the same manner to make pure $Tl_2Ba_2Ca_2Cu_3O_{10}$ films.

Each precursor film 26 on its respective substrate 14 was then suspended on an unsintered $Tl_3Ba_2Ca_2Cu_3O_x$ bulk body 28 which was placed in an alumina crucible 30. The crucible was then placed inside a tube furnace 32 (see FIG. 1A). The temperature in the furnace 32 was first raised to about 855° C. at an ascending rate of 1° C./min., and kept at 855° C. for 30 minutes, then followed by a furnace cooling at a descending rate of 1° C./min. to 815° C. The furnace 32 was then kept at 815° C. for another 25 hours. Finally the power to the furnace 32 was turned off and the samples were allowed to cool to room temperature inside the furnace. The resultant superconducting thin films were made up of Tl-2223 ($Tl_2Ba_2Ca_2Cu_3O_{10}$) with elemental gold interspersed therein, and pure Tl-2223 $Tl_2Ba_2Ca_2Cu_3O_{10}$ without gold.

The $T_c$ and $J_c$ (transport critical current density) values of the samples having the 0.5×5×5 mm³ dimensions were measured by the standard four probe technique, using an AC frequency of 27 Hz for the $T_c$ measurements. The samples having the 0.5×10×10 mm³ dimensions were evaluated using a non-destructive method (Claassen et al., *Rev. Sci. Instrum.*, 62, 996 (1991)), which was calibrated by comparing with the four probe method. Using both measurement techniques, the $J_c$ was measured at 77 K with zero magnetic field. X-ray diffraction studies were performed by Cu-$K_\alpha$ radiation using a DIANO DTM 1057 diffractometer. Scanning Electron Microscopy (SEM) was carried out on a Philips 515 Scanning Electron Microscope with EDAX 9900 system.

Figure 2:
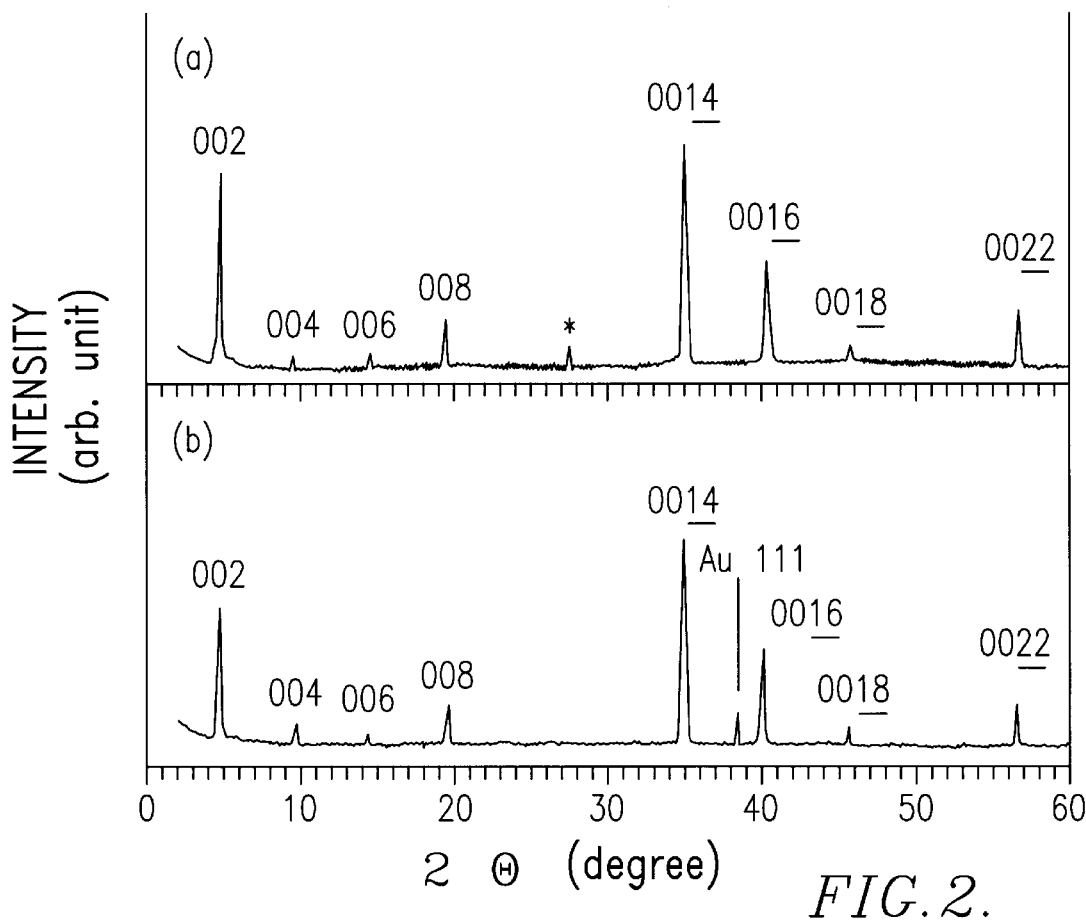
FIG. 2 is an X-ray diffraction pattern of two comparative samples, namely Tl-2223 on MgO substrate (sample A), and Tl-2223 +5% by weight gold on MgO substrate (sample B)

FIG. 2 depicts an X-ray diffraction pattern of samples deposited on an MgO substrate. Sample A is Tl-2223 without gold addition, and illustrates that the sample is single phase with the C axis of the crystallites totally oriented. Sample B is the gold-containing Tl-2223 sample, and again illustrates the presence of a pure 2223 phase with aligned C axis, and also the presence of gold reflection peak 111.

SEM analyses demonstrate the epitaxial texture of the films, which consist of thin crystalline plates forming layered plateaus. In one specific study, sample A above was analyzed, and compared with another sample (sample C, $Tl_2Ba_2Ca_2Cu_3O_{10}$ +5% weight gold) where use was made of $LaAlO_3$ substrate. For sample A, the thickness of the film is uneven and voids with dimensions of several $\mu$m can be found. The $LaAlO_3$ sample C had a more even thickness with less and much smaller voids. The difference between these samples may be due to the difference of lattice dimensions between MgO and $LaAlO_3$. The lattice dimension of MgO is 4.2 Å, which is about 9% larger than 3.85 Å, the length of the a-axis of the tetragonal $Tl_2Ba_2Ca_2Cu_3O_{10}$. The lattice dimension of $LaAlO_3$ is 5.387 Å, which is about 1% shorter than the diagonal of the ab plane of the lattice of $Tl_2Ba_2Ca_2Cu_3O_{10}$. It appears that matching of lattices between the substrate and the deposited high $T_c$ ceramic is very important for fabricating high quality epitaxial films. The size of the plate grains are in the range of 10 $\mu$m for both of the SEM samples, which is larger than the grain size of the same material reported by other groups. Energy dispersive X-ray analyses indicate that the distribution of Tl, Ba, Ca, and Cu are even in the samples, and no excessive $Tl_2O_3$ was found. The SEM analyses also revealed that the distribution of gold is uniform in the samples.

Figure 3:
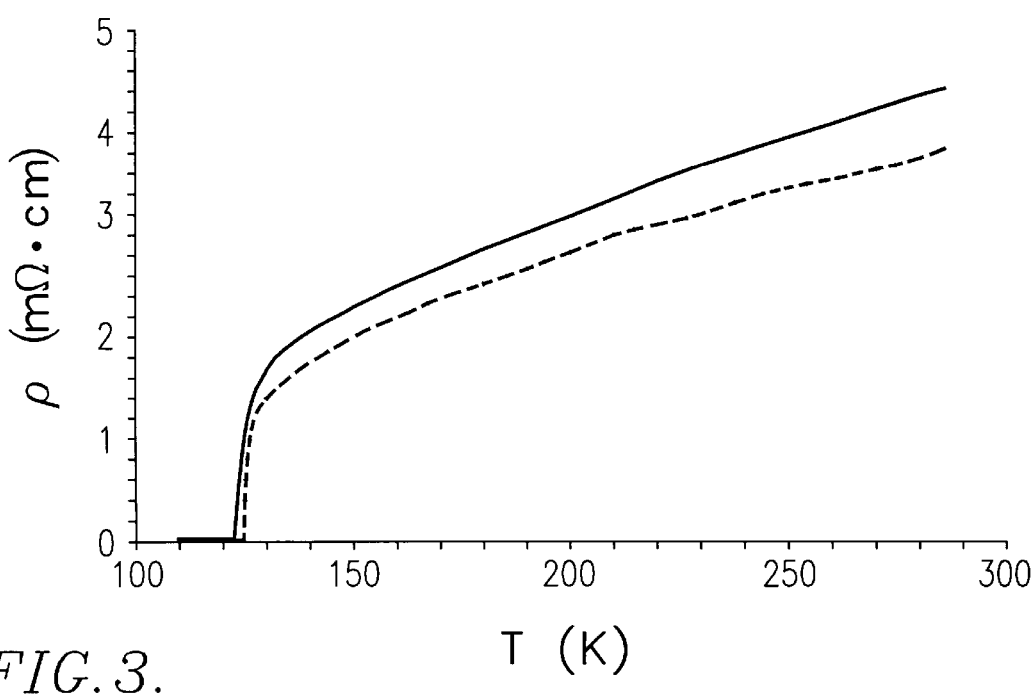
FIG. 3 is a comparative resistance versus temperature curve for samples A and B.

FIG. 3 depicts the resistance versus temperature (R–T) curves of the samples A and B analyzed in FIG. 2. The $T_c$ (zero) of the gold-free $Tl_2Ba_2Ca_2Cu_3O_{10}$ sample A is 124 K, and the $J_c$ was measured to be 7.5×10⁵ A/cm². The comparative gold-containing Tl-2223 sample B had a $T_c$ (zero) of 122 K and a $J_c$ of 4.0×10⁵ A/cm². A similar $T_c$ (zero) and $J_c$ comparative analysis was conducted, using sample C described previously and an otherwise identical Tl-2223 on $LaAlO_3$ gold-free sample D. the $T_c$ (zero) was 116 K for sample D and 124 K for sample C. The $J_c$ was 3.2×10⁶ A/cm² for sample D and 7.0×10⁶ A/cm² for sample C. The critical temperature of 124 K in a thin film superconductor is higher than any previously reported $T_c$. The fact that samples supported on the $LaAlO_3$ substrates have higher $J_c$ values is believed to be due to the better uniformity of these films.

The initial motive for adding gold into a thin film superconductor was to create vortex pinning centers so as to enhance the current carrying capacity of the material. Although silver was found to be harmful in the context of these films, gold has no negative effect and does enhance superconductive properties. Inasmuch as there are many voids on the films using MgO substrates, the pinning centers created by gold addition are meaningless. On the other hand, films deposited on the $LaAlO_3$ substrates have better uniformity and so it is believed that the increase of the gold impurity pinning centers causes an increase in current carrying capacities.

The transport critical current density values of $10^5$–$10^7$ A/cm$^2$ for the Tl-2223 films of the present invention are among the highest reported for high temperature superconductor films. Moreover, the higher critical temperature values of these materials give them an intrinsic advantage at liquid nitrogen temperatures, as compared with rare-earth $YBa_2Cu_3O_7$ materials (which have a $T_c$ (zero) of slightly higher than 90 K), and the $(Bi, Pb)_2Sr_2Ca_2Cu_3O_{10}$ (with a $T_c$ (zero) of about 105 K) materials. The high $T_c$ (zero) and $J_c$ Tl-2223 gold-containing films of the invention therefore have heretofore unobtainable properties making them especially useful in high temperature superconducting devices.

We claim:

1. A method for making a high temperature thin film superconductor comprising the steps of:

forming a non-superconducting precursor film on a compatible substrate, said substrate presenting a pair of opposed surfaces, said film being located on one of said substrate faces with the other opposed substrate face being essentially free of said film;

placing said substrate with said precursor film thereon in contact with an unsintered self-sustaining, solid bulk body containing thaltium;

said substrate with said precursor thereon being located relative to said body so that said one substrate face bearing said precursor film having a substantial portion thereof out of contact with an in spaced relationship to the adjacent surface of said body; and sintering said substrate with said precursor film thereon with said unsintered bulk body to form a thin film superconductor having the formula $Q_n Tl_x M_z Ca_q Cu_d O_{10-y}$ where Q is selected from the group consisting of Pb, Rb, Hg, Cr, Re, K, Na, Se, and Te, M is selected from the group consisting of Ba and Sr, n ranges from about 0–1.0, and y is an oxygen deficiency factor which is less than about 1, said superconductor having an atomic ratio of Tl:M:Ca:Cu of 2:2:2:3 and having a $T_c$ (zero) of greater than about 120 K and a $J_c$ at 77 K and zero magnetic field of about $10^5$ A/cm$^2$ or greater.

2. The method of claim 1, said superconductor having a thickness of up to about 10,000 Å.

3. The method of claim 1, said substrate being selected from the group consisting of MgO, $LaAlO_3$, $SrTiO_3$ and $NdGaO_3$.

4. The method of claim 1, said unsintered bulk body having the formula $Tl_3Ba_2Ca_2Cu_3O_x$.

5. The method of claim 1, said unsintered bulk body having a depression therein, said substrate with said precursor film therein being placed within said depression with said one face bearing said precursor film facing upwardly.

6. The method of claim 1, including the step of forming said precursor film on said substrate by laser ablation.

7. The method of claim 1, including the step of forming said precursor film with a quantity of gold admixed therein.

8. The method of claim 7, said gold being up to about 10% by weight of said precursor film.

9. The method of claim 8, said gold being present at a level of from about 3–8% by weight of said precursor film.

10. The method of claim 1, said non-superconducting precursor film comprising Ba:Ca:Cu:O 223 material.

11. The method of claim 1, said bulk body presenting an upwardly opening concave region defined by opposed sidewall surfaces, said substrate with said precursor thereon being positioned within said concave region with said precursor film facing the opening presented by said concave region.

* * * * *